(12) United States Patent
Kimura

(10) Patent No.: US 7,315,295 B2
(45) Date of Patent: Jan. 1, 2008

(54) DRIVING METHOD FOR ELECTRO-OPTICAL DEVICE, ELECTRO-OPTICAL DEVICE, AND ELECTRONIC APPARATUS

(75) Inventor: Mutsumi Kimura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/956,994

(22) Filed: Sep. 21, 2001

(65) Prior Publication Data

US 2002/0044109 A1    Apr. 18, 2002

(30) Foreign Application Priority Data

Sep. 29, 2000    (JP) .............................. 2000-300856

(51) Int. Cl.
    *G09G 3/30*    (2006.01)
(52) U.S. Cl. .............................. 345/92; 345/76; 345/94
(58) Field of Classification Search .......... 345/60–100, 345/204, 214, 211; 315/169.1, 169.2, 169.3
    See application file for complete search history.

(56) References Cited

U.S. PATENT DOCUMENTS

| | | | | |
|---|---|---|---|---|
| 5,349,366 A | * | 9/1994 | Yamazaki et al. ............. | 345/92 |
| 5,543,947 A | * | 8/1996 | Mase et al. ..................... | 345/89 |
| 5,627,560 A | * | 5/1997 | Verhulst ....................... | 345/97 |
| 5,844,535 A | * | 12/1998 | Itoh et al. ...................... | 345/92 |
| 5,903,248 A | * | 5/1999 | Irwin ........................... | 345/98 |
| 5,926,160 A | * | 7/1999 | Furuya ......................... | 345/98 |

(Continued)

FOREIGN PATENT DOCUMENTS

EP    1 096 465 A2    5/2001

(Continued)

OTHER PUBLICATIONS

Tatsuya Shimoda et al., "High Resolution Light Emitting Polymer Display Driven by Low Temperature Polysilicon Thin Film Transistor with Integrated Driver", Asia Display, pp. 217-220.

(Continued)

*Primary Examiner*—David L. Lewis
(74) *Attorney, Agent, or Firm*—Oliff & Berridge, PLC

(57) ABSTRACT

The invention provides a method for implementing a multi-level display of an electro-optical device according to a time ratio gray-scale method without providing reset lines. In an electro-optical device that includes, at an intersection of a scanning line and a data line, an electro-optical element, a driving transistor that drives the electro-optical element, and a switching transistor that controls the driving transistor, a gray-scale is obtained by performing a plurality of set-reset operations. Each set-reset operation includes: a setting step of supplying an on-signal to the switching transistor via the scanning line, and of supplying a set signal to select a conducting state or a non-conducting state of the driving transistor to the driving transistor via the data line and the switching transistor in accordance with the one signal; and a resetting step of supplying an on-signal to the switching transistor via the scanning line, and of supplying a reset signal to select the non-conducting state of the driving transistor to the driving transistor via the data line and the switching transistor in accordance with the one signal.

15 Claims, 11 Drawing Sheets

U.S. PATENT DOCUMENTS

| | | | |
|---|---|---|---|
| 5,956,105 A | 9/1999 | Yamazaki et al. | |
| 6,225,750 B1 * | 5/2001 | Kimura | 345/92 |
| 6,380,688 B1 * | 4/2002 | Bae et al. | 345/60 |
| 6,522,319 B1 * | 2/2003 | Yamazaki | 345/94 |
| 6,528,950 B2 * | 3/2003 | Kimura | 345/92 |
| 6,528,951 B2 * | 3/2003 | Yamazaki et al. | 345/77 |
| 6,545,656 B1 * | 4/2003 | Yamazaki | 345/94 |
| 6,583,576 B2 * | 6/2003 | Koyama | 345/92 |
| 6,781,567 B2 * | 8/2004 | Kimura | 345/92 |
| 2001/0035849 A1 * | 11/2001 | Kimura et al. | 345/76 |
| 2002/0097213 A1 * | 7/2002 | Ozawa | 345/92 |
| 2002/0109656 A1 * | 8/2002 | Hiroki | 345/92 |

FOREIGN PATENT DOCUMENTS

| | | |
|---|---|---|
| EP | 1 168 291 A2 | 1/2002 |
| JP | 04 328791 | 11/1992 |
| JP | 05-088646 A | 9/1993 |
| JP | 05-035202 A | 12/1993 |
| JP | 07-64055 A | 10/1995 |
| JP | A-9-251279 | 9/1997 |
| JP | 10-319908 A | 4/1998 |
| JP | A 10-214060 | 8/1998 |
| JP | A 10-232649 | 9/1998 |
| JP | A 10-333641 | 12/1998 |
| JP | A-11-73158 | 3/1999 |
| JP | A-2000-250480 | 9/2000 |
| JP | 2001-060076 | 3/2001 |
| WO | WO99/42983 | 8/1999 |

OTHER PUBLICATIONS

Mutsumi Kimura et al., "Low-Temperature Polysilicon Thin-Film Transistor Driving with Integrated Driver for High-Resolution Light Emitting Polymer Display", IEEE Transactions on Electron Devices, vol. 46, No. 12, Dec. 1999, pp. 2282-2288.

M. Kimura et al., "Low-Temperature Poly-Si TFT Driven Light-Emitting-Polymer Displays and Digital Gray Scale for Uniformity", IDW '99, pp. 171-174.

M. Kimura et al., "Low-Temperature Poly-Si TFT Display Using Light-Emitting-Polymer", AM-LCD 2000, pp. 245-248.

Mutsumi Kimura et al., "TFT-LEPD with Image Uniformity by Area Ratio Gray Scale", pp. 71-74.

M. Kimura et al., "An Area-Ratio Gray-Scale Method to Achieve Image Uniformity in TFT-LEPDs", Journal of the SID 8/2, 2000, pp. 93-97.

Mayumi Mizukami et al., 36.1: 6-Bit Digital VGA OLED, SID 00 Digest, pp. 912-915.

Kazutaka Inukai et al., "36.4L: Late-News Paper: 4.0-in. TFT-OLED Displays and a Novel Digital Driving Method", SID 00 Digest, pp. 924-927.

* cited by examiner

DRIVING METHOD FOR
ELECTRO-OPTICAL DEVICE,
ELECTRO-OPTICAL DEVICE, AND
ELECTRONIC APPARATUS

BACKGROUND OF THE INVENTION

1. Field of Invention

The present invention relates to a driving method for an organic electro-luminescence display device, a driving method for an electro-optical device suitable for use with an organic electro-luminescence display device the electro-optical device, and an electronic apparatus provided with such an electro-optical device.

2. Description of Related Art

Attention is being given to organic electro-luminescence (electric-field luminescence) display devices using organic materials as luminescent materials of luminescent elements since they have a wide viewing angle, and will potentially meet market demands, i.e., demands for thinner, lighter, smaller, and lower power-consuming display devices.

Unlike conventional liquid crystal display devices, in organic electro-luminescence display devices, the luminescence state of the luminescent element must be controlled by a current. One such control method is the conductance control method (T. Shimoda, M. Kimura, et al., Proc. Asia Display 98, 217; M. Kimura, et al., IEEE Trans. Ele. Dev. 46, 2282 (1999); M. Kimura, et al., Proc. IDW 99, 171; and M. Kimura et al., Dig. AM-LCD 2000, to be published). In this method, the luminescence state of the luminescent element is controlled by a current value, which is an analog value, and more specifically, it is controlled by changing the potential applied to a gate electrode of a driving transistor for driving the luminescent element. When thin-film transistors having different current characteristics are used, however, the difference in the current characteristics of the individual transistors may sometimes directly result in non-uniformity in the luminescence state of the luminescent elements.

Accordingly, the area ratio gray-scale method (M. Kimura, et al., Proc. Euro Display '99 Late-News Papers, 71, Japanese Unexamined Patent Application Publication No. 11-073158, M. Kimura, et al., Proc. IDW 99, 171, M. Kimura, et al, J. SID, to be published; and M. Kimura, et al., Dig. AM-LCD 2000 to be published) has been proposed. In the area ratio gray-scale method, unlike the above-mentioned conductance control method, the luminescence state of the luminescent elements is controlled without using a luminescence state at an intermediate luminance. More specifically, in this method, a gray-scale is displayed as follows. Pixels disposed in a matrix are divided into a plurality of sub-pixels, and it is determined whether the luminescent elements contained in the sub-pixels are either in a complete luminescence state or a complete non-luminescence state. Then, among the plurality of sub-pixels, the total area of the sub-pixels in the complete luminescence state is changed. In the area ratio gray-scale method, it is not necessary to set an intermediate current value corresponding to the luminescence state of the intermediate luminance. Accordingly, the influence of the current characteristics of the transistors for driving the luminescent elements can be reduced, thereby achieving a uniform image quality. In this method, however, the number of gray-scale levels is restricted by the number of sub-pixels. For a greater number of gray-scale levels, pixels must be divided into a greater number of sub-pixels, which makes the pixel structure complicated.

Accordingly, the time ratio gray-scale method (M. Kimura, et al., Proc. IDW 99, 171; M. Kimura, et al., Dig. AM-LCD 2000, to be published; M. Mizukami, et al., Dig. SID 2000, 912; and K. Inukai, et al., Dig. SID 2000, 924) has been proposed.

In the time ratio gray-scale method, the representation of the gray-scale is implemented by changing the period for which the luminescent elements in one frame are in the complete luminescence state. Accordingly, unlike the area ratio gray-scale method, it is not necessary to provide many sub-pixels to obtain a greater number of gray-scale levels. Also, the time ratio gray-scale method can be used together with the area ratio gray-scale method. Thus, it is expected that the time ratio gray-scale method will be a promising method for digitally displaying a gray-scale.

SUMMARY OF THE INVENTION

However, in the SES (Simultaneous-Erasing-Scan) time ratio gray-scale method, which is reported in "K. Inukai, et al., Dig. SID 2000, 924", in addition to the scanning lines, reset lines are required, and thus, the luminescence area is disadvantageously reduced. Accordingly, a first object of the present invention is to provide a method for implementing the representation of a gray-scale of an electro-optical device without reset lines, and in particular, to provide a method for implementing the representation of the gray-scale of an electro-optical device, such as an organic electro-luminescence display device, according to the time ratio gray-scale method. A second object of the present invention is to provide an electro-optical device that is driven by the above-described driving method.

In order to achieve the first object, a first driving method for an electro-optical device according to the present invention is a driving method for an electro-optical device which includes, at an intersection of a scanning line and a data line, an electro-optical element, a driving transistor that drives the electro-optical element, and a switching transistor that controls the driving transistor. The driving method includes: a setting step of supplying a first on-signal to the switching transistor via the scanning line, and of supplying a set signal to select a conducting state or a non-conducting state of the driving transistor to the driving transistor via the data line and the switching transistor in accordance with a period for which the first on-signal is supplied; and a resetting step of supplying a second on-signal to the switching transistor via the scanning line, and of supplying a reset signal to select the non-conducting state of the driving transistor to the driving transistor via the data line and the switching transistor in accordance with a period for which the second on-signal is supplied.

With this arrangement, since the on-signal is supplied to the switching transistor via the scanning line, and the set signal or the reset signal is supplied via the data line in accordance with the on-signal, the state of the electro-optical element can be selected without a reset line. In this specification, the electro-optical element and the electro-optical device respectively indicate an element and a device in which the luminescence state or the optical characteristic is electrically controlled. Specific examples of the electro-optical device include but are not limited to display devices, such as luminescence display devices, liquid crystal display devices, and electrophoretic display devices.

Throughout the specification, the on-signal indicates a signal for selecting the on-state of the switching transistor. Also, throughout the specification, the "step of supplying a first on-signal to the switching transistor via the scanning line, and of supplying a set signal to select a conducting state or a non-conducting state of the driving transistor to the driving transistor via the data line and the switching transistor in accordance with a period for which the first on-signal is supplied" is defined as the "setting step". The "step of supplying a second on-signal to the switching transistor via the scanning line, and of supplying a reset signal to select the non-conducting state of the driving transistor to the driving transistor via the data line and the switching transistor in accordance with a period for which the second on-signal is supplied" is defined as the "resetting step". The first on-signal and the second on-signal are not necessarily two consecutive on-signals, and may be discretely set.

A second driving method for an electro-optical device according to the present invention is provided such that the horizontal scanning period may include a first sub horizontal scanning period to perform the setting step and a second sub horizontal scanning period to perform the resetting step. The first sub horizontal scanning period and the second sub horizontal scanning period are different from each other. Accordingly, the setting step and the resetting step do not overlap with each other. The first sub horizontal scanning period and the second sub horizontal scanning period are not necessarily two consecutive horizontal scanning periods, and may be discretely set. It is not necessary that the first sub horizontal scanning period and the second sub horizontal scanning period be included in the same horizontal scanning period, and may be included in different horizontal scanning periods.

According to a third driving method for an electro-optical device of the present invention, in the above-described driving method for an electro-optical device, the setting step may be performed in a first horizontal scanning period, and the resetting step may be performed in a second horizontal scanning period. The first sub horizontal scanning period and the second sub horizontal scanning period are different from each other. Accordingly, the setting step and the resetting step do not overlap with each other. The setting step and the resetting step do not have to be performed throughout the whole horizontal scanning period, and may be partially performed in the horizontal scanning period. The first sub horizontal scanning period and the second sub horizontal scanning period are not necessarily two consecutive horizontal scanning periods, and may be discretely set.

According to a fourth driving method for an electro-optical device of the present invention, in the above-described driving method for an electro-optical device, a gray-scale may be obtained by performing a plurality of set-reset operations, each set-reset operation including the aforementioned setting step and the resetting step. Accordingly, the state of the electro-optical device is selected in the setting step, and remains the same until the resetting step is performed. Thus, by performing a plurality of set-reset operations, a gray-scale can be obtained. Throughout the specification, the set-reset operation is defined as an operation including the above-described setting step and the resetting step.

According to a fifth driving method for an electro-optical device of the present invention, in the above-described driving method for an electro-optical device, a time interval between the setting step and the resetting step may be different for each of the plurality of set-reset operations.

According to a sixth driving method for an electro-optical device of the present invention, in the above-described driving method for an electro-optical device, the time interval between the setting step and the resetting step for each of the plurality of set-reset operations may be completely different from each other, and the ratio of time intervals for the plurality of set-reset operations may be about $1:2:\ldots:2^n$ (n being an integer of one or more). For example, if two set-reset operations with a time interval ratio of 1:2 are performed, four gray-scale levels, i.e., 0, 1, 2, 3, can be displayed. If two set-reset operations with a time interval ratio of 1:1 are performed, three gray-scale levels, i.e., 0, 1, and 2 can be displayed. That is, in this driving method for an electro-optical device, a maximum number of gray-scale levels can be obtained by a minimum number of set-reset operations. The time interval ratio does not have to be precisely $1:2:\ldots:2^n$ (n is an integer of one or more), and may be sufficient to such a degree so as to satisfy a required gray-scale precision.

According to a seventh driving method for an electro-optical device of the present invention, in the above-described driving method for an electro-optical device, the set signal may be a signal to set the driving transistor to the conducting state rather than the signal to select the conducting state or the non-conducting state of the driving transistor. This means that an intermediate conducting state other than the two states, i.e., the conducting state and the non-conducting state, of the driving transistor is selectable. This can be implemented by the set signal provided as a voltage having three or more consecutive or discrete values. This driving method is effective to implement many gray-scale levels.

According to an eighth driving method for an electro-optical device of the present invention, in the above-described driving method for an electro-optical device, the electro-optical element may be an organic electro-luminescence element. Generally, the power consumption of the organic electro-luminescence element is advantageously low.

A first electro-optical device of the present invention is driven by the above-described driving method for an electro-optical device.

A second electro-optical device of the present invention is an electro-optical device including, at an intersection of a scanning line and a data line, an electro-optical element, a driving transistor that drives the electro-optical element, and a switching transistor that controls the driving transistor. The electro-optical device includes a drive circuit that generates a signal to set the switching transistor to be an on-state or an off-state, and for generating a signal to set or reset the driving transistor in accordance with the signal to set the switching transistor to be the on-state or the off-state.

A third electro-optical device of the present invention is an electro-optical device including, at an intersection of a scanning line and a data line, an electro-optical element, a driving transistor that drives the electro-optical element, and a switching transistor that controls the driving transistor. The electro-optical device includes: a scanning line driver that supplies a signal to set the switching transistor to be an on-state or an off-state to the scanning line; and a data line driver that supplies a signal to set or reset the driving transistor to the data line in accordance with an operation of the scanning line driver.

A fourth electro-optical device of the present invention is an electro-optical device including, at an intersection of a scanning line and a data line, an electro-optical element, a driving transistor that drives this electro-optical element, and a switching transistor that controls this driving transistor. In the fourth electro-optical device, an on-signal to perform a setting step of setting the electro-optical element and a resetting step of resetting the electro-optical element is supplied to the switching transistor via the scanning line.

In the above description, the definitions of the setting step and the resetting step are substantially similar to those of the setting step and the resetting step set forth above. Accordingly, the first through fourth electro-optical devices of the present invention do not require a reset line that performs the time ratio gray-scale method. Advantageously, therefore, it is possible to ensure a sufficient area for the electro-optical element. If more gray-scale levels are required, the time ratio gray-scale method can be employed with the area ratio gray-scale method when sub pixels are provided in the pixels of the electro-optical device.

According to a fifth electro-optical device of the present invention, in the above-described electro-optical device, the electro-optical element may be an organic electro-luminescence element.

A first electronic apparatus of the present invention is an electronic apparatus in which the above-described electro-optical device is installed.

DETAILED DESCRIPTION OF PREFERRED EMBODIMENTS

Preferred embodiments of the present invention are described below.

A basic circuit used in an embodiment of the present invention includes a poly-crystal silicon thin-film transistor formed by a low-temperature process at 600° C. or lower (low-temperature poly-Si TFT). The low-temperature poly-Si TFT can be formed on a large, inexpensive glass substrate, and can integrate a driving circuit on a panel, and accordingly, it is suitable for manufacturing an electro-optical device. Additionally, the low-temperature poly-Si TFT is small, but has a high current supplying power. Accordingly, it is suitable for use in a high-precision current luminescence display device. The present invention is also applicable to an electro-optical device driven by other types of transistors, such as an amorphous silicon thin-film transistor (a-Si TFT), a silicon-based transistor, and an organic thin-film transistor using an organic semiconductor.

Figure 1:
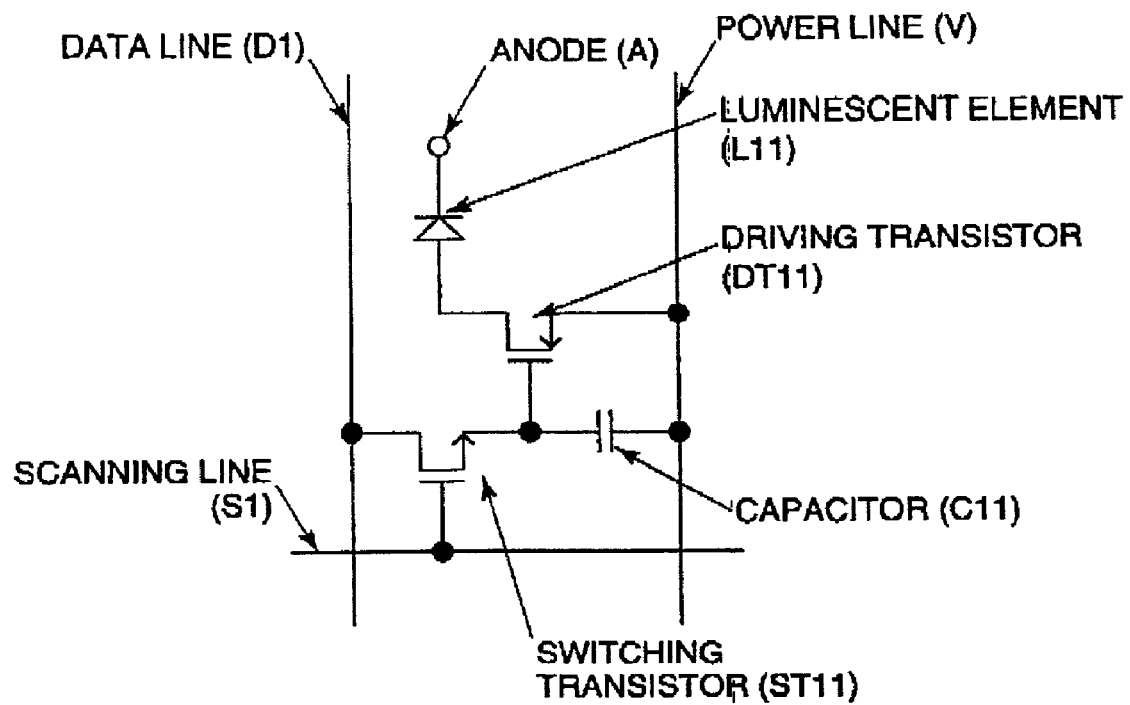
FIG. 1 is a schematic of a pixel equivalent circuit of an electro-optical device according to an embodiment of the present invention.

The equivalent circuit of one pixel of an electro-optical device according to an embodiment of the present invention is shown in FIG. 1. In this embodiment, a luminescent element is used as the electro-optical element. In this electro-optical device, a scanning line (S1), a data line (D1), and a power line (V) are formed, and a luminescent element (L11), a driving transistor (DT11) that drives the luminescent element (L11), a switching transistor (ST11) that controls this driving transistor (DT11), and a capacitor (C11) are provided at the intersection of the scanning line (S1) and the data line (D1). One end of the luminescent element (L11) is connected to an anode (A). The driving transistor (DT11) is p-type. Accordingly, the driving transistor (DT11) enters a conducting state selected by a low-potential data signal to cause the luminescent element (L11) to be in the luminescence state. In contrast, the driving transistor (DT11) enters a non-conducting state selected by a high-potential data signal to cause the luminescent element (L11) to be in the non-luminescence state. In the pixel equivalent circuit shown in FIG. 1, the switching transistor (ST11) is n-type, and the driving transistor (DT11) is p-type. However, the present invention is not limited to this structure or its function.

Figure 2:
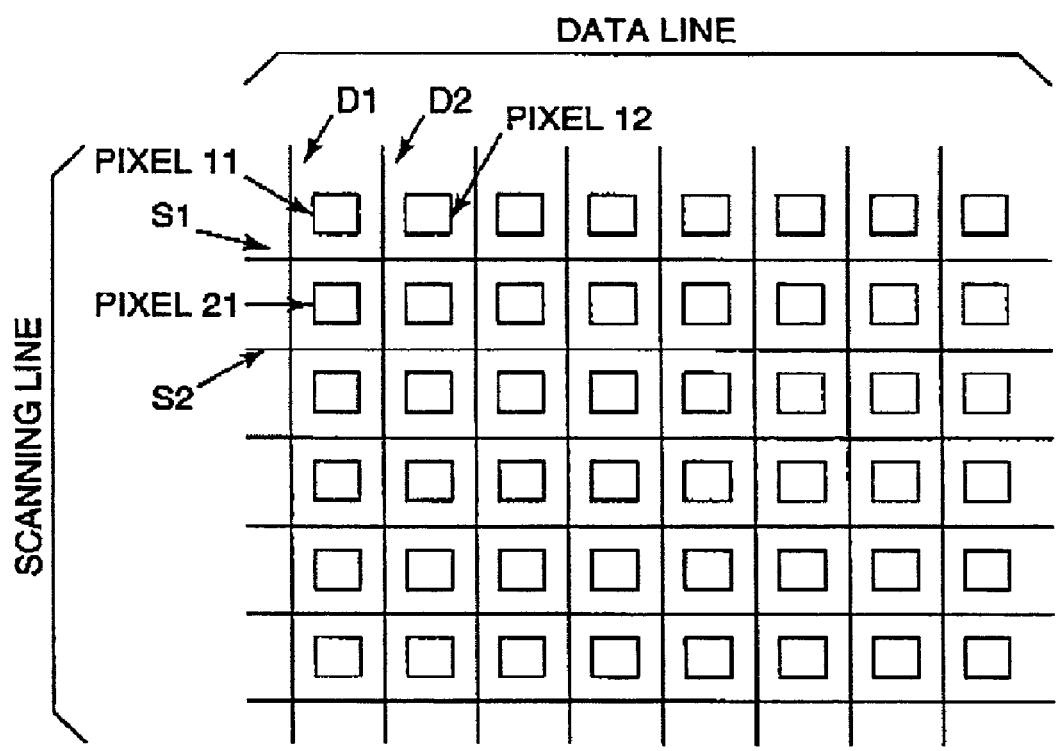
FIG. 2 is a schematic of a pixel arrangement of an electro-optical device according to an embodiment of the present invention.

FIG. 2 illustrates wiring and a pixel arrangement of an electro-optical device according to an embodiment of the present invention. Pixels are arranged in a matrix by a plurality of scanning lines (S1, S2, . . . ) and a plurality of data lines (D1, D2, . . . ), and a plurality of pixels are formed at corresponding intersections of the scanning lines and the data lines. For example, a pixel 11 is provided at the intersection of S1 and D1. Basically, the pixel includes a switching transistor (ST11), a capacitor (C11), a driving transistor (DT11), and a luminescent element (L11), such as those shown in FIG. 1. However, the pixel may include a plurality of sub-pixels. A power line is not shown in FIG. 2.

Figure 3:
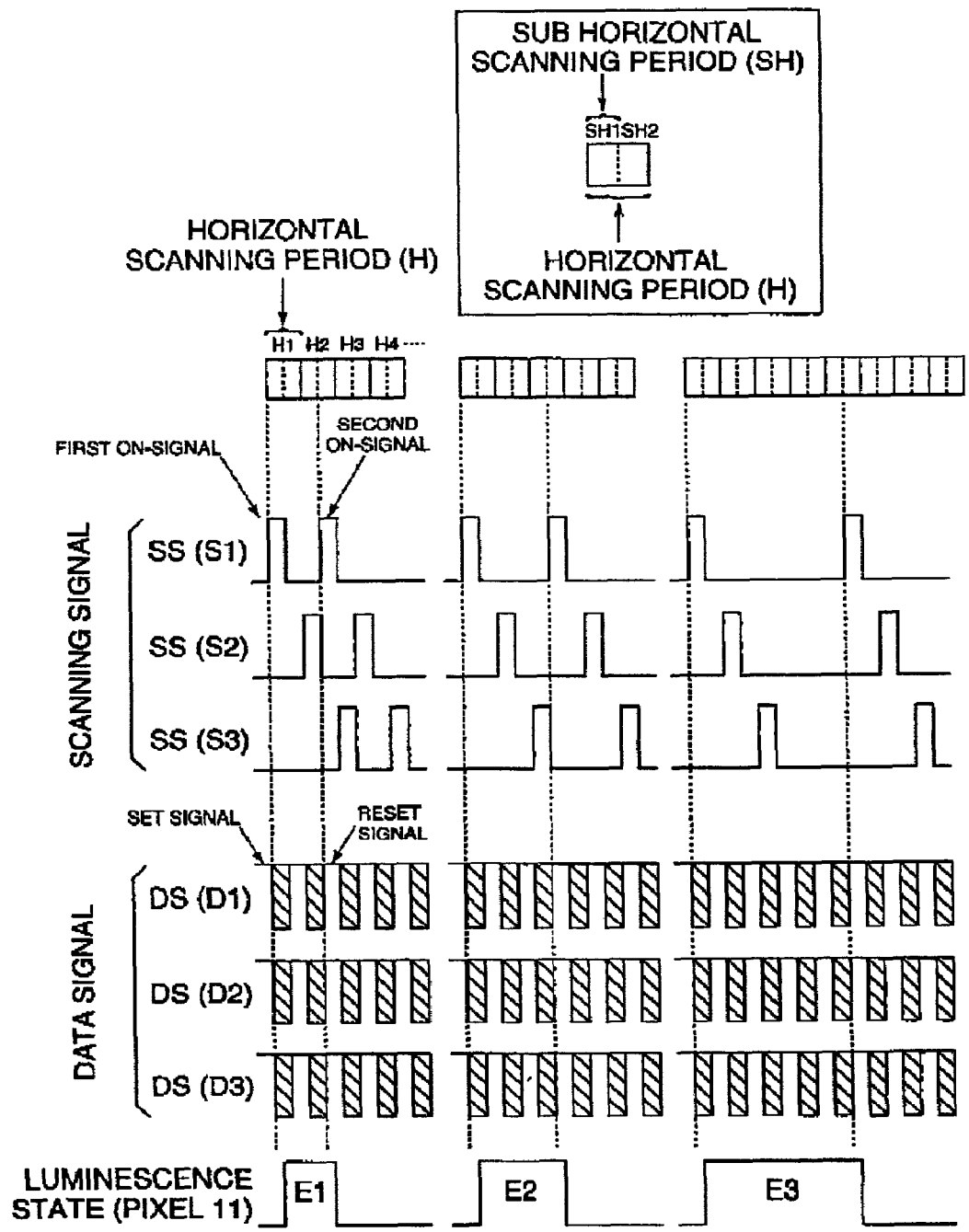
FIG. 3 is a schematic of a driving method for an electro-optical apparatus according to an embodiment of the present invention.

FIG. 3 illustrates a driving method for an electro-optical device according to an embodiment of the present invention. In this driving method, a horizontal scanning period (H) includes two sub horizontal scanning periods (SH1 and SH2). The scanning signal and the data signal are either a high-potential signal or a low-potential signal. A first scanning signal SS(S1) is supplied to the first scanning line (S1). A second scanning signal SS(S2) is supplied to the second scanning line (S2). A third scanning signal SS(S3) is supplied to the third scanning line (S3). A first data signal DS(D1) is supplied to the first data line (D1). A second data signal DS(D2) is supplied to the second data line (D2). A third data signal DS(D3) is supplied to the third data line (D3). In DS(D1), DS(D2), and DS(D3), the hatched portions indicate a set signal, while the other portions indicate a reset signal. A low-potential data signal, which causes the luminescent element to be in the luminescence state, is supplied as the set signal. A high-potential set signal is supplied to cause the luminescent element to be in the non-luminescence state.

In the sub horizontal scanning period SH1 of the horizontal scanning period H1, the luminescent element is set to be in the luminescence state or the non-luminescence state by a setting step of "supplying a first on-signal to the switching transistor (ST11) via the scanning line (S1), and of supplying the set signal to select the conducting state or the non-conducting state of the driving transistor (DT11) to the driving transistor (DT11) via the data line D1 and the switching transistor (ST11) in accordance with the period for which the first on-signal is supplied". In the sub horizontal scanning period SH2 of the horizontal scanning period H2, the luminescent element is set to be in the non-luminescence state by a resetting step of "supplying a second on-signal to the switching transistor (ST11) via the scanning line (S1), and of supplying the reset signal to select the non-conducting state of the driving transistor (DT11) to the driving transistor (DT11) via the data line D1 and the switching transistor (ST11) in accordance with the period for which the second on-signal is supplied". According to the above-described setting step and resetting step, the luminescence period (E1) of the first-row and first-column pixel 11 is set. It may take some time for the transistor or the luminescent element to respond to the corresponding signal. Accordingly, as shown in FIG. 3, the start time and the end time of the luminescence period may be displaced from the start of the setting step and the start of the resetting step, respectively. In FIG. 3, the period for which the first on-signal is supplied coincides with the period for which the set signal is supplied, and the period for which the second on-signal is supplied coincides with the period for which the reset signal is supplied. However, depending on the circumstances of the use or the specifications, the on-signal does not always have to coincide with the set signal or the reset signal.

The setting step and the resetting step for the subsequent scanning line (S2) are performed such that they are displaced from those for the scanning line (S1). As shown in FIG. 3, they are preferably performed at times that are closest to those for the scanning line (S1). Thereafter, similarly, the setting step and the resetting step are performed for the third scanning line (S3) and the subsequent scanning lines. Then, one vertical scanning period is finished. For the subsequent vertical scanning period, the setting step and the resetting step are similarly performed for each scanning line. The ratio of the luminescence periods E1, E2, and E3 is about 1:2:4. As a result, eight gray-scale levels, such as 0, 1, 2, 3, 4, 5, 6, and 7, are obtained.

Figure 4:
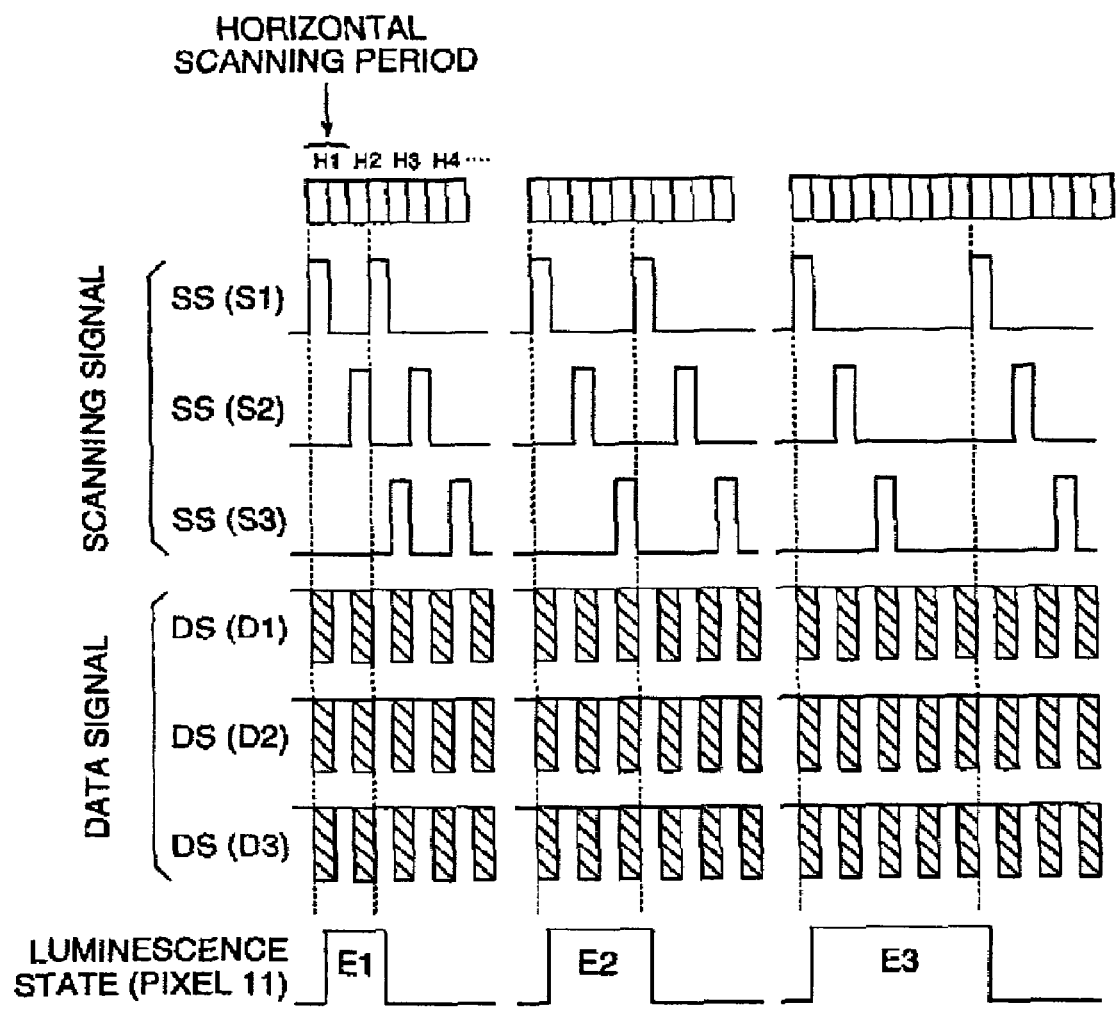
FIG. 4 is a schematic of a driving method for an electro-optical apparatus according to an embodiment of the present invention.

In the embodiment shown in FIG. 3, one horizontal scanning period is divided into two sub horizontal scanning periods. However, as shown in FIG. 4, the setting step and the resetting step may be set in units of horizontal scanning periods. In FIG. 4, the period of the setting step and the period of the resetting step respectively coincide with the horizontal scanning period. However, neither the setting step nor the resetting step has to be performed throughout the whole horizontal scanning period.

Figure 5:
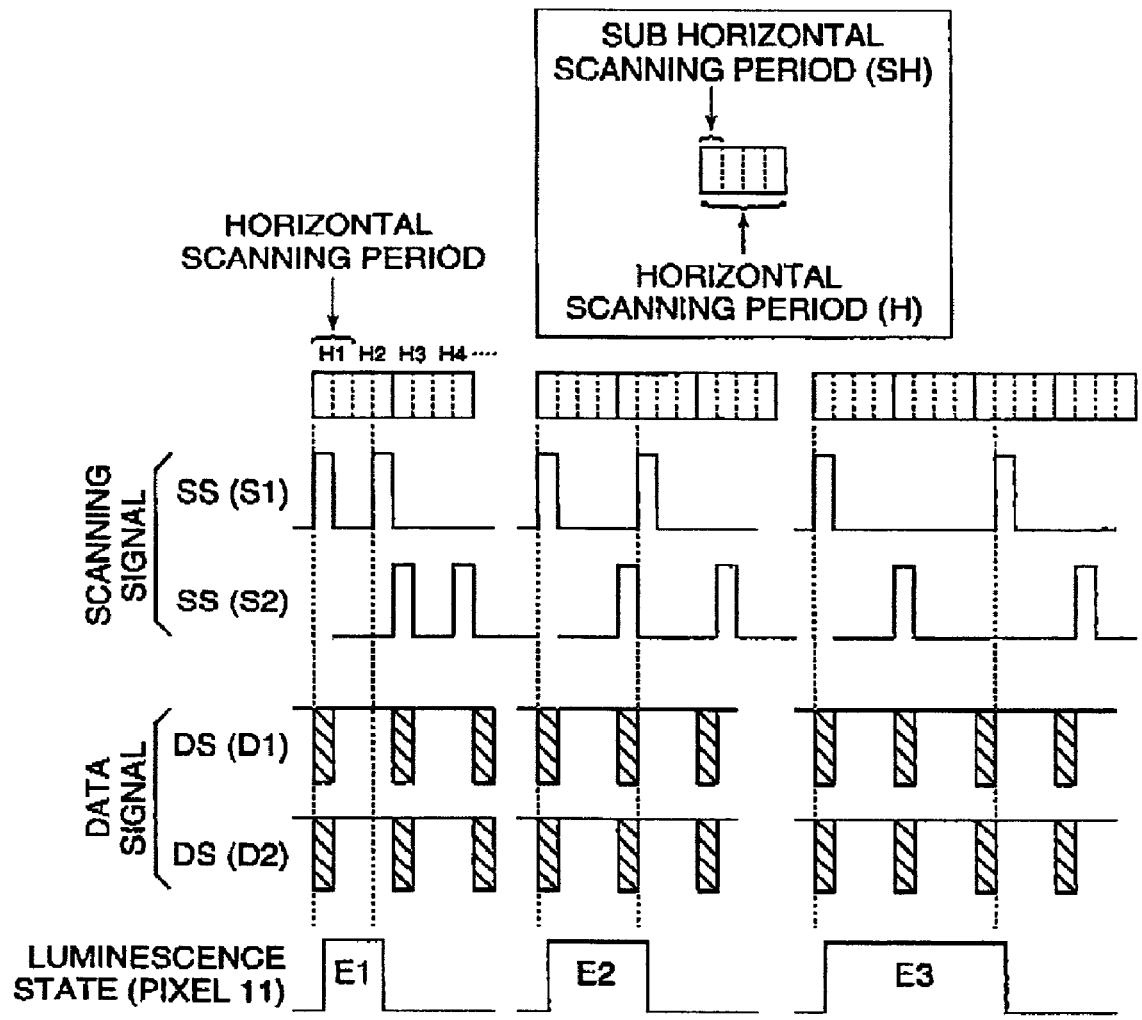
FIG. 5 is a schematic of a driving method for an electro-optical apparatus according to an embodiment of the present invention.

Among a plurality of set-reset operations, a set-reset operation may be partially or wholly performed during the same horizontal scanning period. Such an embodiment is shown in FIG. 5. In this embodiment, the setting step and the resetting step are performed in units of sub horizontal scanning periods (SH) which are obtained by dividing the horizontal scanning period (H) into four. The first set-reset operation is performed in the same horizontal scanning period. In the second and the subsequent set-reset operations, the horizontal scanning period of the sub horizontal scanning period for which the setting step is performed is different from that of the sub horizontal scanning period for which the resetting step is performed. In each vertical scanning period, upon completion of the horizontal scanning period for the first scanning line (S1), the set-reset operation is started for the second scanning line (S2). Thereafter, the set-reset operation is similarly formed for the third scanning line (S3) and the subsequent scanning lines.

In any of the driving methods for the electro-optical devices shown in FIGS. 3 through 5, the set-reset operations are sequentially performed such that the time interval between the setting step and the resetting step is increased. However, the set-reset operations do not have to be performed in this order, and can be performed according to the circumstances of the use or the specifications. As in the driving methods for the electro-optical devices shown in FIGS. 3 through 5, for simplicity of a peripheral circuit system, such as a data line driver, the reset signal is preferably supplied at regular intervals. However, it is not essential that the reset signal be supplied at regular intervals, and the timing to supply the on-signal and the reset signal to the switching transistor can suitably be set according to the desired luminescence period.

Figure 6:
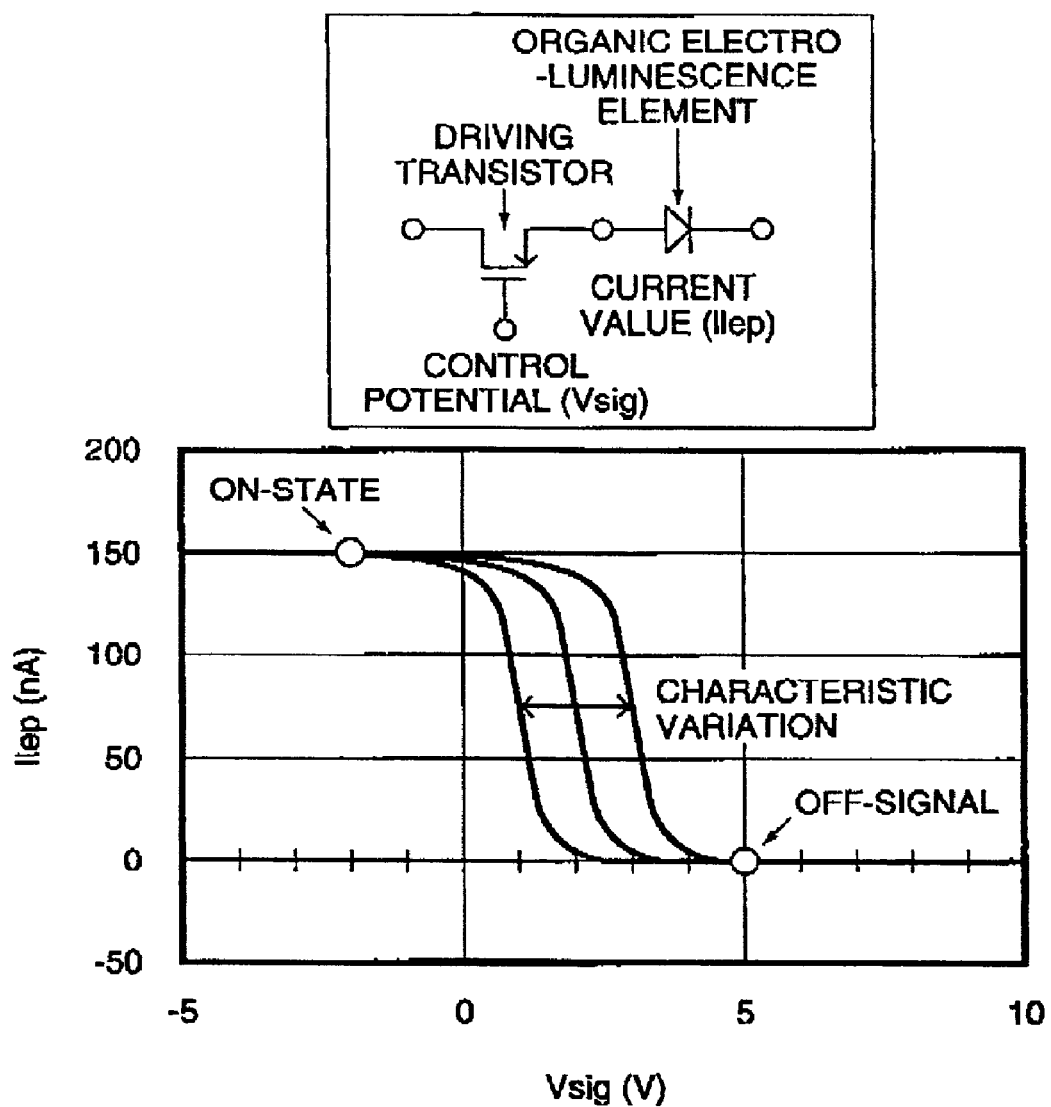
FIG. 6 is a schematic and chart of the current characteristics of a luminescent element according to an embodiment of the present invention.
Figure 7:
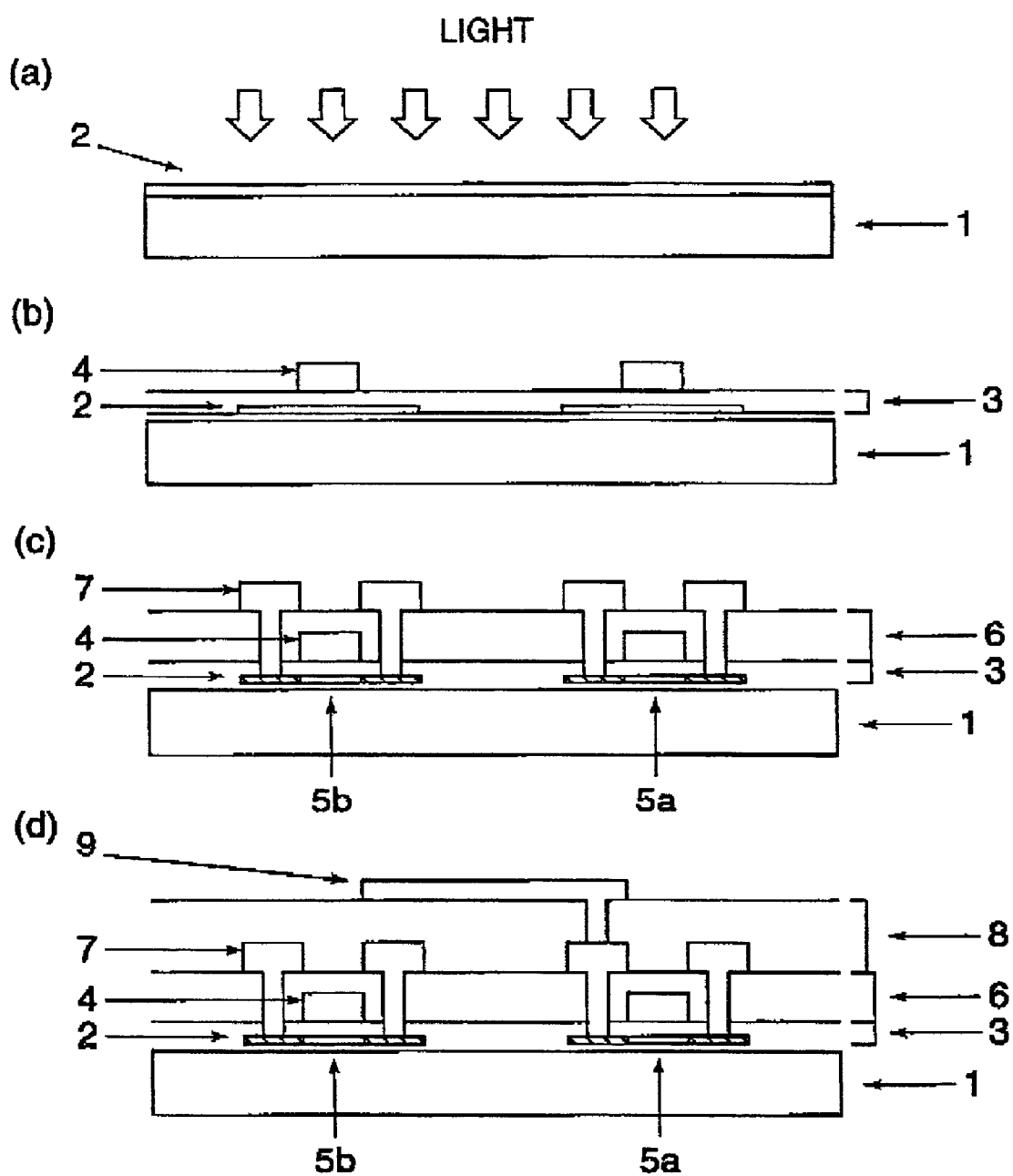
FIGS. 7(a)–7(d) are schematics of part of a manufacturing process for an electro-optical device according to an embodiment of the present invention.

FIG. 6 illustrates current characteristics of the luminescent element according to an embodiment of the present invention. The horizontal axis represents control potential (Vsig) supplied to the gate electrode of the driving transistor, and the vertical axis designates current value (Iiep) of the organic electro-luminescence device. The current value and the luminance of the organic electro-luminescence device are substantially proportional to each other. Thus, it can be considered that the vertical axis also indicates the luminance. In this embodiment, it is preferable that the organic electro-luminescence device is unambiguously controlled to be either in the on state or the off state. When the electro-luminescence device is unambiguously in the on state or in the off state, the current value (Iiep) is substantially constant. Thus, a variation in the transistor characteristics does not change the current value of the luminescent element, and accordingly, the luminance substantially becomes uniform. Therefore, the image quality can be uniform.

FIGS. 7(a)–7(d) illustrate a manufacturing process for a thin-film transistor for use in the electro-optical device according to an embodiment of the present invention. Amorphous silicon is first formed on a glass substrate 1 by PECVD using $SiH_4$ or by LPCVD using $Si_2H_6$. The amorphous silicon is poly-crystallized by a laser, such as an excimer laser, or by solid-phase growth, thereby forming a poly-crystalline silicon layer 2 (FIG. 7(a)). After the poly-crystalline silicon layer 2 is patterned, a gate insulating film 3 is formed, and gate electrodes 4 are further formed (FIG. 7(b)). An impurity, such as phosphorus or boron, is implanted into the poly-crystalline silicon layer 2 by the gate electrodes 4 according to a self-alignment process so as to form MOS transistors 5a and 5b. The MOS transistors 5a and 5b are a p-type transistor and an n-type transistor, respectively. After a first interlayer insulating film 6 is formed, contact holes are formed, and a source electrode and a drain electrode 7 are formed (FIG. 7(c)). Then, after a second interlayer insulating film 8 is formed, contact holes are formed, and a pixel electrode 9 including ITO is formed (FIG. 7(d)).

Figure 8:
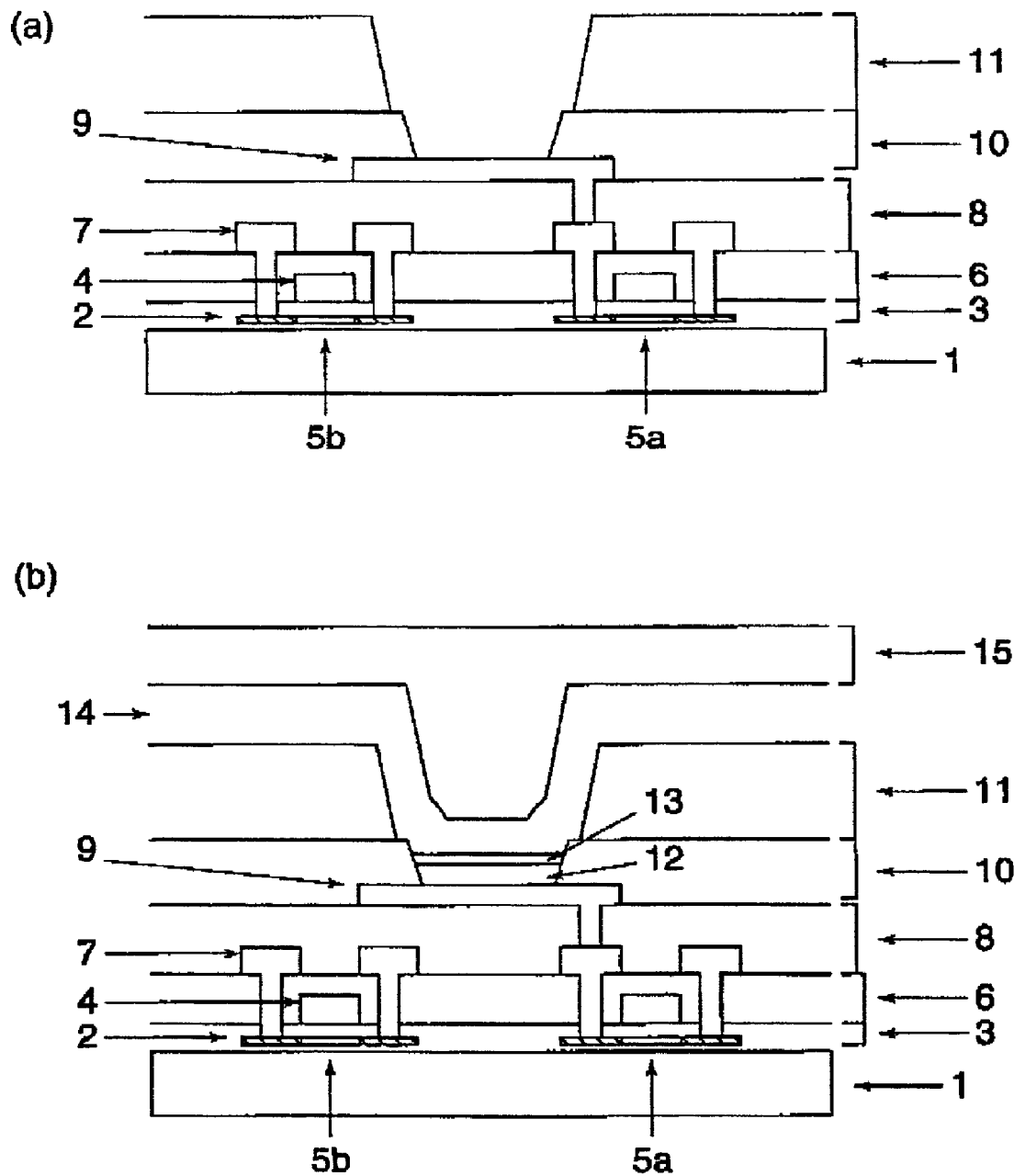
FIGS. 8(a) and 8(b) are schematics of part of a manufacturing process for an electro-optical device according to an embodiment of the present invention.

FIGS. 8(a) and 8(b) illustrate a manufacturing process for pixels used in the electro-optical device according to an embodiment of the present invention. First, an adhesion layer 10 is formed, and an opening corresponding to a luminescent region is formed. An interlayer 11 is then formed, and an opening is formed (FIG. 8(a)). Then, the wettability of the substrate surface is controlled by performing plasma processing using, for example, oxygen plasma or $CF_4$ plasma. Subsequently, an electron-hole implantation layer 12 and a luminescent layer 13 are formed according to a liquid-phase process, such as a spin coating, squeegee, or ink-jet process, or a vacuum process, such as sputtering or deposition. An anode 14 containing metal, such as aluminum, is then formed. Finally, a sealing layer 15 is formed. Thus, an organic electro-luminescence device is manufactured (FIG. 8(*b*)). The roles of the adhesion layer 10 are to enhance the adhesion between the substrate and the interlayer 11 and also to obtain an accurate luminescence area. The roles of the interlayer 11 are to reduce the parasitic capacitance by separating the gate electrodes 4, the source electrodes, and the drain electrodes 7 from the anode 14, and also to perform precise patterning by controlling the surface wettability when forming the electron-hole implantation layer 12 and the luminescent layer 13 by a liquid-phase process.

Figure 9:
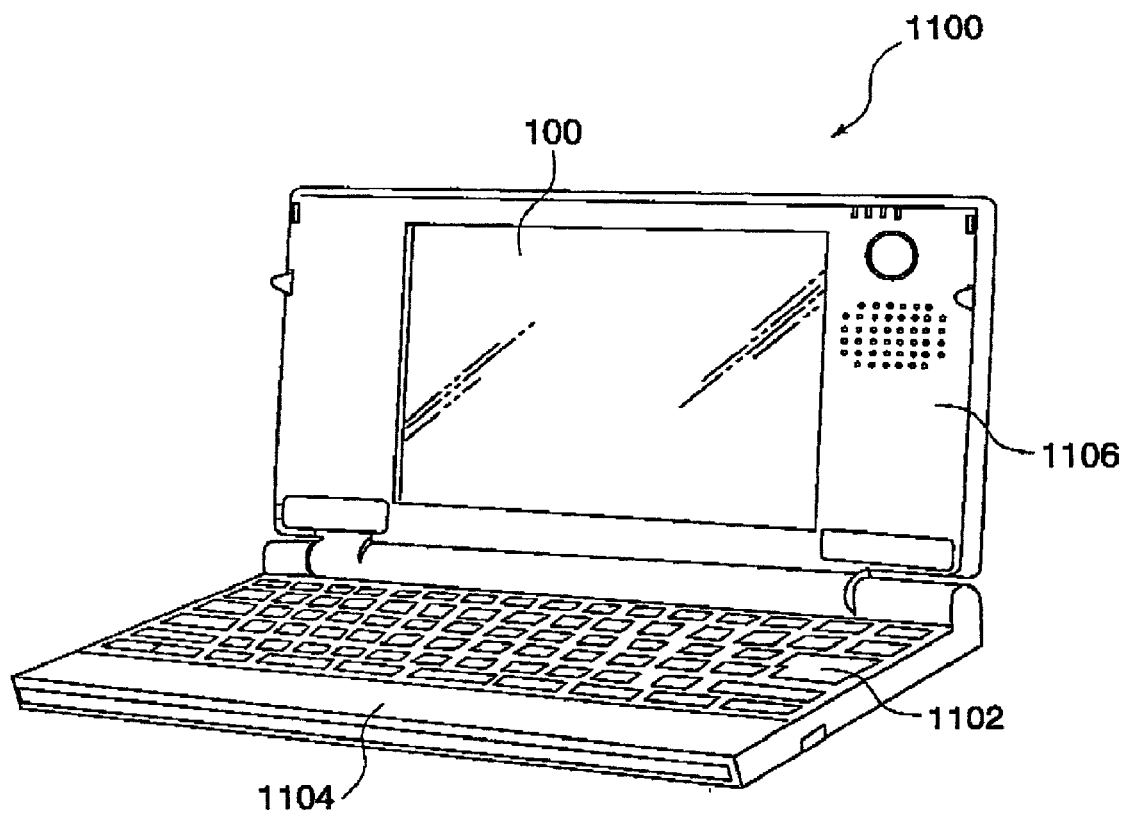
FIG. 9 is a perspective view of an example of an electro-optical device of an embodiment of the present invention applied to a mobile personal computer.

Some examples of electronic apparatuses using the above-described electro-optical device are described below. FIG. 9 is a perspective view illustrating the configuration of a mobile personal computer to which the above-described electro-optical device is applied. In FIG. 9, a personal computer 1100 includes a main unit 1104 provided with a keyboard 1102, and a display unit 1106. The display unit 1106 is provided with the above-described electro-optical device 100.

Figure 10:
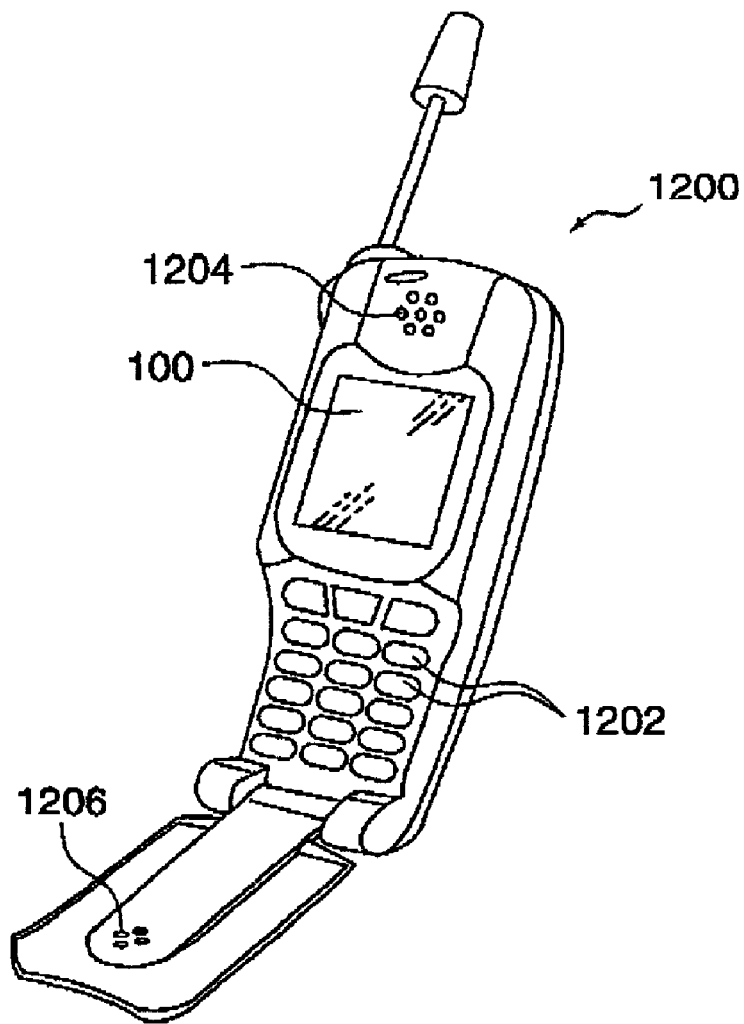
FIG. 10 is a perspective view of an example of an electro-optical device of an embodiment of the present invention applied to a display unit of a cellular telephone.

FIG. 10 is a perspective view illustrating the configuration of a cellular telephone having a display unit to which the aforementioned electro-optical device 100 is applied. In FIG. 10, a cellular telephone 1200 includes, not only a plurality of operation buttons 1202, but also the above-described electro-optical device 100 together with an earpiece 1204 and a mouthpiece 1206.

Figure 11:
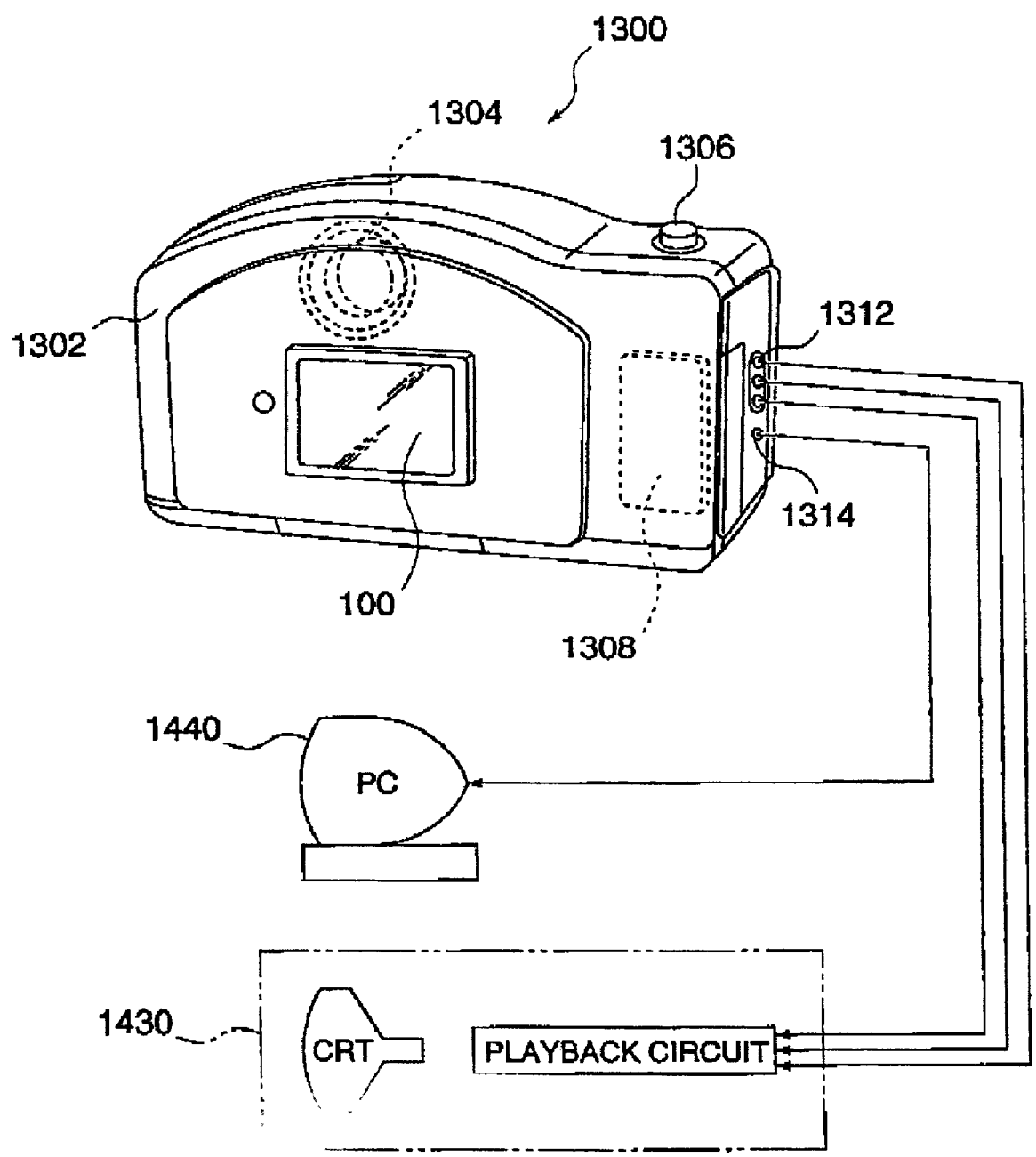
FIG. 11 is a perspective view of a digital still camera having a finder to which an electro-optical device of an embodiment of the present invention is applied.

FIG. 11 is a perspective view illustrating the configuration of a digital still camera having a finder to which the above-described electro-optical device 100 is applied. FIG. 11 also schematically illustrates the connection of the digital still camera with external devices. In a regular camera, a film is exposed to light by an optical image of a subject. In a digital still camera 1300, however, an optical image of a subject is photoelectrically converted by an image pickup device, such as a CCD (Charge Coupled Device), so as to generate an imaging signal. On the rear surface of a casing 1302 of the digital still camera 1300, the aforementioned electro-optical device 100 is provided to display the subject based on the imaging signal obtained by the CCD. That is, the electro-optical device 100 serves as a finder to display the subject. A photodetector unit 1304, including an optical lens and a CCD, is disposed on the observation side (on the reverse surface in FIG. 11) of the casing 1302.

A photographer checks the subject displayed on the electro-optical device 100 and presses a shutter button 1306. Then, an imaging signal obtained by the CCD is transferred to and stored in a memory of a circuit board 1308. In this digital still camera 1300, a video signal output terminal 1312 and a data communication input/output terminal 1314 are provided on the side surface of the casing 1302. Then, as shown in FIG. 11, a television monitor 1430 and a personal computer 1440 are connected to the video signal output terminal 1312 and the data communication input/output terminal 1314, respectively, as required. The imaging signal stored in the memory of the circuit board 1308 is output to the television monitor 1430 or the personal computer 1440 by a predetermined operation.

Electronic apparatuses to which the electro-optical device 100 of the present invention is applicable include, not only the personal computer shown in FIG. 9, the cellular telephone shown in FIG. 10, and the digital still camera shown in FIG. 11, but also a liquid crystal television, a view-finder-type or direct-view-type video cassette recorder, a car navigation system, a pager, an electronic diary, a calculator, a word processor, a workstation, a videophone, a POS terminal, a device provided with a touch panel, for example. The above-described electro-optical device 100 is applicable to the display units of these electronic apparatuses.

The invention claimed is:

1. A driving method for an electro-luminescent device which includes, corresponding to an intersection of a scanning line and a data line, a power line, an electro-luminescent element, a driving transistor that controls a current flowing through the electro-luminescent element, the electro-luminescent element emitting light by the current and a switching transistor that controls the driving transistor, the driving method comprising:

a setting step of supplying a first on-signal to the switching transistor via the scanning line, and of supplying a set signal to select a conducting state or a non-conducting state of the driving transistor to the driving transistor via the data line and the switching transistor in accordance with a period for which the first on-signal is supplied;

a resetting step of supplying a second on-signal to the switching transistor via the scanning line, and of supplying a reset signal to select the non-conducting state of the driving transistor to the driving transistor via the data line and the switching transistor in accordance with a period for which the second on-signal is supplied; and a horizontal scanning period that includes a first sub horizontal scanning period to perform the setting step and a second sub horizontal scanning period to perform the resetting step; wherein the period for which the first on-signal is supplied coincides with a period for which the set signal is supplied.

2. The driving method for an electro-luminescent device according to claim 1, further including performing the setting step in a first horizontal scanning period, and performing the resetting step in a second horizontal scanning period.

3. The driving method for an electro-luminescent device according to claim 1, further including obtaining a grayscale by performing a plurality of set-reset operations, each set-reset operation including the setting step and the resetting step.

4. The driving method for an electro-luminescent device according to claim 3, further including providing a time interval between the setting step and the resetting step that is different for each of the plurality of set-reset operations.

5. The driving method for an electro-luminescent device according to claim 3, further including providing the time interval between the setting step and the resetting step for each of the plurality of set-reset operations to be completely different from each other, and the ratio of time intervals for the plurality of set-reset operations being set to be about 1:2: . . . :2n (n is an integer of one or more) based on the minimum time interval.

6. The driving method for an electro-luminescent device according to claim 1, further including providing the set signal to be a signal for setting the conducting state for the driving transistor rather than the signal for selecting the conducting state or the non-conducting state of the driving transistor.

7. The driving method for an electro-luminescent device according to claim 1, further including driving the electro-luminescent element including an organic electro-luminescence element.

8. An electro-luminescent device driven by the driving method according to claim 1.

9. An electro-luminescent device, comprising:
    a scanning line;
    a data line;
    a power line;
    an electro-luminescent element corresponding to an intersection of the scanning line and the data line;
    a driving transistor that controls a current flowing through the electro-luminescent element, the electro-luminescent element emitting light by the current;
    a switching transistor that controls the driving transistor;
    a drive circuit that generates a signal to set the switching transistor to be an on-state or an off-state, and that generates a signal to set or reset the driving transistor in accordance with the signal to set the switching transistor to be the on-state or the off-state; and
    a horizontal scanning period that includes a first sub horizontal scanning period to perform the setting step and a second sub horizontal scanning period to perform the resetting step; wherein
    a period for which a first on-signal is supplied to the switching transistor coincides with a period for which the set signal is supplied.

10. An electro-luminescent device, comprising:
    a scanning line;
    a data line;
    a power line;
    an electro-luminescent element corresponding to an intersection at the scanning line and the data line;
    a driving transistor that controls a current flowing through the electro-luminescent element, the electro-luminescent element emitting light by the current;
    a switching transistor that controls the driving transistor;
    a scanning line driver that supplies a signal to set the switching transistor to be an on-state or an on-state to the scanning line;
    a data line driver that supplies a signal to set or reset the driving transistor to the data line in accordance with an operation of the scanning line driver;
    a period of supplying the signal to reset the driving transistor via the data line within a vertical scanning period being substantially constant; and
    a horizontal scanning period that includes a first sub horizontal scanning period to perform the setting step and a second sub horizontal scanning period to perform the resetting step; wherein
    a period for which a first on-signal is supplied to the switching transistor coincides with a period for which the set signal is supplied.

11. An electro-luminescent device, comprising:
    a scanning line;
    a data line;
    a power line;
    an electro-luminescent element corresponding to an intersection of the scanning line and the data line;
    a driving transistor that controls a current flowing through the electro-luminescent element, the electro-luminescent element emitting light by the current;
    a switching transistor that controls the driving transistor, an on-signal to perform a setting step of setting the electro-luminescent element and a resetting step of resetting the electro-luminescent element being supplied to the switching transistor via the scanning line;
    a horizontal scanning period that includes a first sub horizontal scanning period to perform the setting step and a second sub horizontal scanning period to perform the resetting step; and
    the number of the signal to perform the setting step and the signal to perform the resetting step being substantially the same; wherein
    a period for which a first on-signal is supplied to the switching transistor coincides with a period for which the set signal is supplied.

12. The electro-luminescent device according to claim 9, the electro-luminescent element including an organic electro-luminescence element.

13. An electronic apparatus, comprising:
    the electro-luminescent device set forth in claim 8.

14. A driving method for an electro-luminescent device which includes, corresponding to an intersection of a scanning line and a data line, an electro-luminescent element, a driving transistor that controls a current flowing through the electro-luminescent element, the electro-luminescent element emitting light by the current and a switching transistor that controls the driving transistor, the driving method comprising:
    a setting step of supplying a first on-signal to the switching transistor via the scanning line, and of supplying a set signal to select a conducting state or a non-conducting state of the driving transistor to the driving transistor via the data line and the switching transistor in accordance with a period for which the first on-signal is supplied;
    a resetting step of supplying a second on-signal to the switching transistor via the scanning line, and of supplying a reset signal to select the non-conducting state of the driving transistor to the driving transistor via the data line and the switching transistor in accordance with a period for which the second on-signal is supplied, the setting step and the resetting step forming a set-reset operation;
    a plurality of the set-reset operation being performed within one frame period, at least two set-reset operations of the plurality of the set-reset operation having mutually different time lengths; and
    a horizontal scanning period that includes a first sub horizontal scanning period to perform the setting step and a second sub horizontal scanning period to perform the resetting step; wherein
    the period for which the first on-signal is supplied coincides with a period for which the set signal is supplied.

15. An electro-luminescent device, comprising:
    a scanning line;
    a data line;
    a power line;
    an electro-luminescent element corresponding to an intersection of the scanning line and the data line;
    a driving transistor that controls a current flowing through the electro-luminescent element, the electro-luminescent element emitting light by the current,
    a switching transistor that controls the driving transistor, an on-signal to perform a setting step of setting the electro-luminescent element and a resetting step of resetting the electro-luminescent element being supplied to the switching transistor via the scanning line;

a horizontal scanning period that includes a first sub horizontal scanning period to perform the setting step and a second sub horizontal scanning period to perform the resetting step; and a plurality of the pairs of the setting step and the resetting step being performed within one frame period; wherein a period for which a first on-signal is supplied to the switching transistor coincides with a period for which the set signal is supplied.

* * * * *

UNITED STATES PATENT AND TRADEMARK OFFICE
CERTIFICATE OF CORRECTION

| | | |
|---|---|---|
| PATENT NO. | : 7,315,295 B2 | |
| APPLICATION NO. | : 09/956994 | |
| DATED | : January 1, 2008 | |
| INVENTOR(S) | : Mutsumi Kimura | |

It is certified that error appears in the above-identified patent and that said Letters Patent is hereby corrected as shown below:

Col. 10, Line 8 should read

1. A driving method for an electro-luminescent device which includes, corresponding to an intersection of a scanning line and a data line, an electro-luminescent element, a driving transistor that controls a current flowing through the electro-luminescent element, the electro-luminescent element emitting light by the current and a switching transistor that controls the driving transistor, the driving method comprising:

a setting step, performed during a first sub horizontal scanning period of a horizontal scanning period, of supplying a first on-signal to the switching transistor via the scanning line, and of supplying a set signal to select a conducting state or a non-conducting state of the driving transistor to the driving transistor via the data line and the switching transistor in accordance with a period for which the first on-signal is supplied;

a resetting step, performed during a second sub horizontal scanning period of the horizontal scanning period, of supplying a second on-signal to the switching transistor via the scanning line, and of supplying a reset signal to select the non-conducting state of the driving transistor to the driving transistor via the data line and the switching transistor in accordance with a period for which the second on-signal is supplied, wherein the period for which the first on-signal is supplied coincides with a period for which the set signal is supplied.

UNITED STATES PATENT AND TRADEMARK OFFICE
CERTIFICATE OF CORRECTION

PATENT NO.        : 7,315,295 B2
APPLICATION NO.   : 09/956994
DATED             : January 1, 2008
INVENTOR(S)       : Mutsumi Kimura It is certified that error appears in the above-identified patent and that said Letters Patent is hereby corrected as shown below:

Col. 10, Line 36 should read

2. The driving method for an electro-luminescent device according to claim 1, further including performing the setting step in a first horizontal scanning period, and performing the resetting step in a second horizontal scanning period.

Col. 10, Line 41 should read

3. The driving method for an electro-luminescent device according to claim 1, further including obtaining a gray-scale by performing a plurality of set-reset operations, each set-reset operation including the setting step and the resetting step.

Col. 10, Line 46 should read

4. The driving method for an electro-luminescent device according to claim 3, further including providing a time interval between the setting step and the resetting step that is different for each of the plurality of set-reset operations.

Col. 10, Line 50 should read

5. The driving method for an electro-luminescent device according to claim 3, further including providing the time interval between the setting step and the resetting step for each of the plurality of set-reset operations to be completely different from each other, and the ratio of time intervals for the plurality of set-reset operations being set to be about $1:2: \ldots :2n$ (n is an integer of one or more) based on the minimum time interval.

UNITED STATES PATENT AND TRADEMARK OFFICE
CERTIFICATE OF CORRECTION

| | |
|---|---|
| PATENT NO. | : 7,315,295 B2 |
| APPLICATION NO. | : 09/956994 |
| DATED | : January 1, 2008 |
| INVENTOR(S) | : Mutsumi Kimura |

It is certified that error appears in the above-identified patent and that said Letters Patent is hereby corrected as shown below:

Col. 10, Line 58 should read

6.   The driving method for an electro-luminescent device according to claim 1, further including providing the set signal to be a signal for setting the conducting state for the driving transistor rather than the signal for selecting the conducting state or the non-conducting state of the driving transistor.

Col. 10, Line 64 should read

7.   The driving method for an electro-luminescent device according to claim 1, further including driving the electro-luminescent element including an organic electro-luminescence element.

Col. 11, Line 1 should read

8.   An electro-luminescent device driven by the driving method according to claim 1.

Col. 11, Line 3 should read

9.   An electro-luminescent device, comprising:

a scanning line;

a data line;

an electro-luminescent element corresponding to an intersection of the scanning line and the data line;

a driving transistor that controls a current flowing through the electro-luminescent element, the electro-luminescent element emitting light by the current;

UNITED STATES PATENT AND TRADEMARK OFFICE
CERTIFICATE OF CORRECTION

| | |
|---|---|
| PATENT NO. | : 7,315,295 B2 |
| APPLICATION NO. | : 09/956994 |
| DATED | : January 1, 2008 |
| INVENTOR(S) | : Mutsumi Kimura |

It is certified that error appears in the above-identified patent and that said Letters Patent is hereby corrected as shown below:

a switching transistor that controls the driving transistor; and a drive circuit that generates a signal to set the switching transistor to be an on-state or an off-state, and that generates a set signal to set the driving transistor during a first sub horizontal scanning period of a horizontal scanning period or a reset signal to reset the driving transistor during a second sub horizontal scanning period of the horizontal scanning period in accordance with the signal to set the switching transistor to be the on-state or the off-state, wherein the drive circuit is configured to supply a first on-signal to the switching transistor during a period that coincides with a period for which the set signal is supplied.

Col. 11, Line 26 should read

10.  An electro-luminescent device, comprising:

a scanning line;

a data line;

an electro-luminescent element corresponding to an intersection at the scanning line and the data line;

a driving transistor that controls a current flowing through the electro-luminescent element, the electro-luminescent element emitting light by the current;

a switching transistor that controls the driving transistor;

UNITED STATES PATENT AND TRADEMARK OFFICE
CERTIFICATE OF CORRECTION

PATENT NO. : 7,315,295 B2
APPLICATION NO. : 09/956994
DATED : January 1, 2008
INVENTOR(S) : Mutsumi Kimura It is certified that error appears in the above-identified patent and that said Letters Patent is hereby corrected as shown below:

a scanning line driver that supplies a signal to set the switching transistor to be an on-state or an off-state to the scanning line; and a data line driver that supplies a set signal to set the driving transistor during a first sub horizontal scanning period of a horizontal scanning period or a reset signal to reset the driving transistor during a second sub horizontal scanning period of the horizontal scanning period to the data line in accordance with an operation of the scanning line driver, wherein the data line driver is configured to supply the reset signal within a vertical scanning period during a period that is substantially constant, and the scanning line driver is configured to supply a first on-signal to the switching transistor during a period that coincides with a period for which the set signal is supplied.

Col. 11, Line 54 should read

11. An electro-luminescent device, comprising:

a scanning line;

a data line;

an electro-luminescent element corresponding to an intersection of the scanning line and the data line;

a driving transistor that controls a current flowing through the electro-luminescent element, the electro-luminescent element emitting light by the current; and

UNITED STATES PATENT AND TRADEMARK OFFICE
CERTIFICATE OF CORRECTION

| | |
|---|---|
| PATENT NO. | : 7,315,295 B2 |
| APPLICATION NO. | : 09/956994 |
| DATED | : January 1, 2008 |
| INVENTOR(S) | : Mutsumi Kimura |

It is certified that error appears in the above-identified patent and that said Letters Patent is hereby corrected as shown below:

a switching transistor that controls the driving transistor, an on-signal to perform a setting step of setting the electro-luminescent element during a first sub horizontal scanning period of a horizontal scanning period and a resetting step of resetting the electro-luminescent element during a second sub horizontal scanning period of the horizontal scanning period being supplied to the switching transistor via the scanning line, wherein a number of the signal to perform the setting step and a number of the signal to perform the resetting step are substantially the same, and the switching transistor is configured to supply a first on-signal to the switching transistor during a period that coincides with a period for which the set signal is supplied.

Col. 12, Line 12 should read

12. The electro-luminescent device according to claim 9, the electro-luminescent element including an organic electro-luminescence element.

Col. 12, Line 16 should read

13. An electronic apparatus, comprising:

the electro-luminescent device set forth in claim 8.

UNITED STATES PATENT AND TRADEMARK OFFICE
CERTIFICATE OF CORRECTION

| | |
|---|---|
| PATENT NO. | : 7,315,295 B2 |
| APPLICATION NO. | : 09/956994 |
| DATED | : January 1, 2008 |
| INVENTOR(S) | : Mutsumi Kimura |

It is certified that error appears in the above-identified patent and that said Letters Patent is hereby corrected as shown below:

Col. 12, Line 18 should read

14. A driving method for an electro-luminescent device which includes, corresponding to an intersection of a scanning line and a data line, an electro-luminescent element, a driving transistor that controls a current flowing through the electro-luminescent element, the electro-luminescent element emitting light by the current and a switching transistor that controls the driving transistor, the driving method comprising:

a setting step, performed during a first sub horizontal scanning period of a horizontal scanning period, of supplying a first on-signal to the switching transistor via the scanning line, and of supplying a set signal to select a conducting state or a non-conducting state of the driving transistor to the driving transistor via the data line and the switching transistor in accordance with a period for which the first on-signal is supplied; and a resetting step, performed during a second sub horizontal scanning period of the horizontal scanning period, of supplying a second on-signal to the switching transistor via the scanning line, and of supplying a reset signal to select the non-conducting state of the driving transistor to the driving transistor via the data line and the switching transistor in accordance with a period for which the second on-signal is supplied, the setting step and the resetting step forming a set-reset operation,

UNITED STATES PATENT AND TRADEMARK OFFICE
CERTIFICATE OF CORRECTION

| | | |
|---|---|---|
| PATENT NO. | : 7,315,295 B2 | |
| APPLICATION NO. | : 09/956994 | |
| DATED | : January 1, 2008 | |
| INVENTOR(S) | : Mutsumi Kimura | |

It is certified that error appears in the above-identified patent and that said Letters Patent is hereby corrected as shown below:

wherein a plurality of the set-reset operations are performed within one frame period, at least two set-reset operations of the plurality of the set-reset operation having mutually different time lengths and the period for which the first on-signal is supplied coincides with a period for which the set signal is supplied.

Col. 12, Line 53 should read

15. An electro-luminescent device, comprising:

a scanning line;

a data line;

an electro-luminescent element corresponding to an intersection of the scanning line and the data line;

a driving transistor that controls a current flowing through the electro-luminescent element, the electro-luminescent element emitting light by the current;

a switching transistor that controls the driving transistor; and a drive circuit that generates an on-signal to perform a setting step of setting the electro-luminescent element during a first sub horizontal scanning period of a horizontal scanning period and a resetting step of resetting the electro-luminescent element during a second sub horizontal scanning period of the horizontal scanning period supplied to the switching transistor via the scanning line,

UNITED STATES PATENT AND TRADEMARK OFFICE
CERTIFICATE OF CORRECTION

PATENT NO. : 7,315,295 B2
APPLICATION NO. : 09/956994
DATED : January 1, 2008
INVENTOR(S) : Mutsumi Kimura It is certified that error appears in the above-identified patent and that said Letters Patent is hereby corrected as shown below:

wherein a plurality of pairs of the setting step and the resetting step are performed within one frame period, and a period for which a first on-signal is supplied to the switching transistor coincides with a period for which a set signal is supplied.

Signed and Sealed this

Third Day of June, 2008

JON W. DUDAS
*Director of the United States Patent and Trademark Office*